United States Patent
Xie et al.

(10) Patent No.: US 12,349,406 B2
(45) Date of Patent: Jul. 1, 2025

(54) HYBRID GATE CUT FOR STACKED TRANSISTORS

(71) Applicant: INTERNATIONAL BUSINESS MACHINES CORPORATION, Armonk, NY (US)

(72) Inventors: Ruilong Xie, Niskayuna, NY (US); Chen Zhang, Guilderland, NY (US); Jingyun Zhang, Albany, NY (US); Carl Radens, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 681 days.

(21) Appl. No.: 17/554,735

(22) Filed: Dec. 17, 2021

(65) Prior Publication Data

US 2023/0197814 A1    Jun. 22, 2023

(51) Int. Cl.
*H10D 30/67*         (2025.01)
*H10D 62/10*         (2025.01)
(Continued)

(52) U.S. Cl.
CPC ..... *H10D 30/6735* (2025.01); *H10D 30/6757* (2025.01); *H10D 62/118* (2025.01);
(Continued)

(58) Field of Classification Search
CPC ........... H10D 30/6735; H10D 30/6757; H10D 84/0128; H10D 84/014; H10D 84/0151;
(Continued)

(56) References Cited

U.S. PATENT DOCUMENTS

2019/0172828 A1   6/2019   Smith et al.
2019/0319112 A1  10/2019   Zang et al.
(Continued)

FOREIGN PATENT DOCUMENTS

| CN | 110741475 A | 1/2020 |
| CN | 113363208 A | 9/2021 |
| WO | 2019112952 A1 | 6/2019 |

OTHER PUBLICATIONS

Lin, Yu-Ru, et al. "Performance of Stacked Nanosheets Gate-All-Around and Multi-Gate Thin-Film-Transistors", Journal of the Electron Devices Society. Oct. 1, 2018, pp. 1187-1191.
(Continued)

*Primary Examiner* — Sitaramarao S Yechuri
(74) *Attorney, Agent, or Firm* — Tutunjian & Bitetto, P.C.; Samuel Waldbaum

(57) ABSTRACT

Semiconductor devices and methods of forming the same include forming a first stack of nanosheets in a first region, the first stack of nanosheets including upper first nanosheets and lower first nanosheets. A second stack of nanosheets is formed in a second region, the second stack of nanosheets including upper second nanosheets and lower second nanosheets. A lower gate cut structure is formed between the lower first nanosheets and the lower second nanosheets. A gate stack is formed on the first and second stack of nanosheets after forming the lower gate cut structure. An upper gate cut structure is formed after forming the gate stack.

20 Claims, 8 Drawing Sheets

(51) Int. Cl.
  *H10D 84/01* (2025.01)
  *H10D 84/03* (2025.01)
  *H10D 84/83* (2025.01)
(52) U.S. Cl.
  CPC ....... *H10D 84/0128* (2025.01); *H10D 84/014* (2025.01); *H10D 84/0151* (2025.01); *H10D 84/038* (2025.01); *H10D 84/83* (2025.01)
(58) Field of Classification Search
  CPC .. H10D 84/038; H10D 84/83; H10D 84/0188; H10D 84/144; H10D 84/201; H10D 84/135; H10D 64/252; H10D 62/118; H10D 62/052; H10D 62/221; H10D 30/014; H10D 30/43; H10D 62/121; H10D 62/151; H10D 84/0177; H10D 84/85; H10D 64/017; H10D 88/00; H10D 88/01; H02K 15/027; H10H 20/826; A61K 40/4218; A23B 2/783; C01G 53/82; H10F 19/908; B82Y 10/00
  See application file for complete search history.

(56) References Cited

U.S. PATENT DOCUMENTS

| | | |
|---|---|---|
| 2019/0326286 A1 | 10/2019 | Xie et al. |
| 2019/0326301 A1 | 10/2019 | Smith et al. |
| 2019/0341475 A1 | 11/2019 | Shu et al. |
| 2020/0035567 A1 | 1/2020 | Chanemougame |
| 2020/0052125 A1 | 2/2020 | Zhou |
| 2020/0294866 A1* | 9/2020 | Cheng ................. H10D 64/017 |
| 2021/0265220 A1 | 8/2021 | Lee |
| 2022/0367520 A1* | 11/2022 | Hong .................... H10D 88/01 |
| 2023/0086084 A1* | 3/2023 | Yun ..................... H10D 84/038 257/401 |

OTHER PUBLICATIONS

International Search Report issued in corresponding PCT Application Serial No. PCT/CN2022/131929 dated Jan. 28, 2023, 5 pgs.

* cited by examiner

HYBRID GATE CUT FOR STACKED TRANSISTORS

BACKGROUND

The present invention generally relates to semiconductor device fabrication, and, more particularly, to gate cut processes in stacked field effect transistor (FET) fabrication.

During metal-oxide-semiconductor FET fabrication, gate cut refers to a process that forms an electrically insulating structure to isolate one region of a gate structure from another, for example to separate the gate region of one complementary metal-oxide-semiconductor (CMOS) cell from another CMOS cell for a fin FET.

SUMMARY

A method of forming a semiconductor device includes forming a first stack of nanosheets in a first region, the first stack of nanosheets including upper first nanosheets and lower first nanosheets. A second stack of nanosheets is formed in a second region, the second stack of nanosheets including upper second nanosheets and lower second nanosheets. A lower gate cut structure is formed between the lower first nanosheets and the lower second nanosheets. A gate stack is formed on the first and second stack of nanosheets after forming the lower gate cut structure. An upper gate cut structure is formed after forming the gate stack.

A method of forming a semiconductor device includes forming a first stack of nanosheets in a first region, the first stack of nanosheets including upper first nanosheets and lower first nanosheets. A second stack of nanosheets is formed in a second region, the second stack of nanosheets including upper second nanosheets and lower second nanosheets. A lower gate cut structure is formed between the lower first nanosheets and the lower second nanosheets. A gate stack is formed on the first and second stack of nanosheets after forming the lower gate cut structure. An upper gate cut structure is formed after forming the gate stack. The formation of the gate stack includes depositing a first work function metal layer on the upper first nanosheets and the upper second nanosheets. The first work function metal layer is etched back to expose the upper first nanosheets and the upper second nanosheets to form a lower work function metal layer. Dielectric plugs are formed between the lower work function metal layer and the lower gate cut structure. A second work function metal layer is deposited on the upper first nanosheets and the upper second nanosheets.

A semiconductor device includes a first stack of channel layers in a first region, the first stack of channels including upper first channels and lower first channels. A second stack of channel layers is in a second region, the second stack of channels including upper second channels and lower second channels. A lower gate cut structure is between the lower gate structure and the lower first channels and the second first channels. A shared gate makes electrical contact with the upper and lower first nanosheets and the upper second nanosheets.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Complementary field effect transistor (CFET) devices pair an n-type field effect transistor (nFET) with a p-type field effect transistor (PFET). CFETs may be used for a variety of applications, such as in certain static random access memory (SRAM) circuits. The pFET and nFET of a given CFET may be stacked on top of one another, thereby reducing the amount of chip area needed.

When fabricating such stacked devices, a gate cut process may be used to separate neighboring CFETs from one another. In some cases, neighboring devices may be connected to one another, and in other cases, neighboring devices may be separated by the gate cut. Some flexibility in how the gate cut isolation structure is formed can therefore help in the fabrication of diverse devices.

Figure 1:
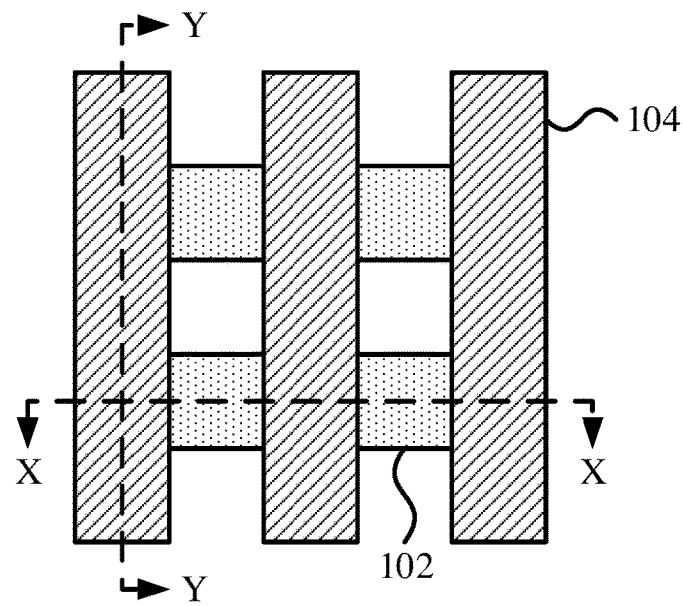
FIG. 1 is a top-down view of a set of complementary field effect transistors (CFETs) that defines cross-sectional views, in accordance with an embodiment of the present invention.

Referring now to FIG. 1, a top-down view of a set of CFET devices is shown. Channels 102 are shown, with gates 104 crossing perpendicularly over them. Two cross-sectional planes are indicated, XX and YY, which will be used herein to show details of the fabrication of the CFET devices. It should be understood that proportions may not be strictly maintained from one figure to the next, and that the structures are shown for the sake of illustration only. Thus, the specific dimensions and proportions shown herein are not intended to be limiting.

Figure 2:
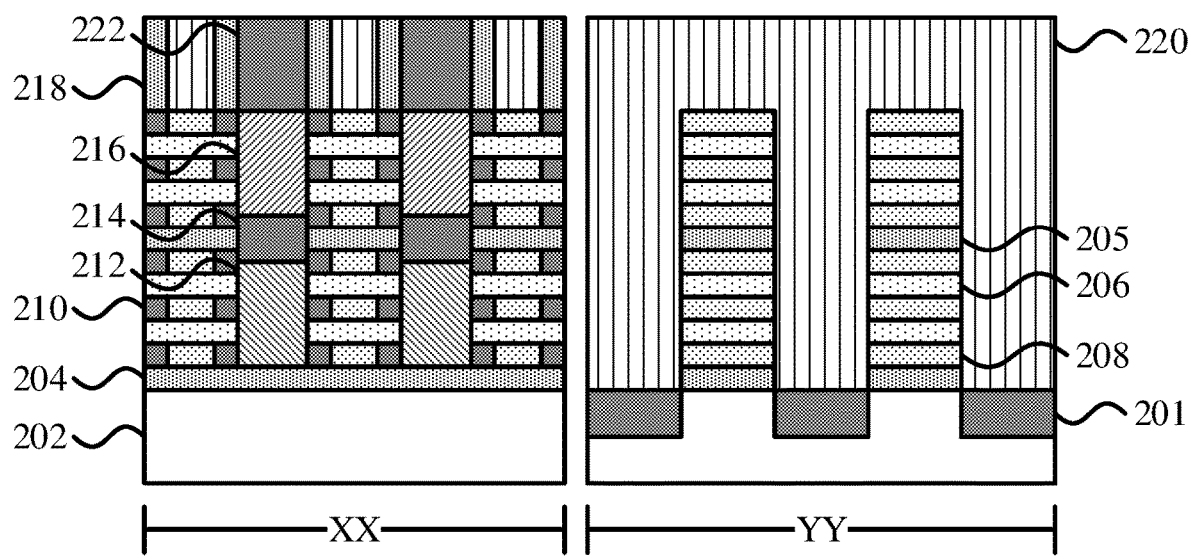
FIG. 2 is a set of cross-sectional views of a step in the formation of stacked CFET devices, where stacks of nanosheets are shown with source/drain structures and dummy gates, in accordance with an embodiment of the present invention.

Referring now to FIG. 2, a set of cross-sectional views of a step in the fabrication of stacked CFET devices is shown. This initial step is shown with a number of structures having already been formed. Although some description is included of how these structures were formed, it should be understood that any appropriate process may be used to form the depicted structures.

An isolation layer 204 is formed on a semiconductor substrate 202. Device regions are separated by shallow trench isolation regions 201. A stack of semiconductor layers is positioned on each of the device regions. The semiconductor layers include top layers and bottom layers, separated by a dielectric isolation layer 205. The stack includes channel semiconductor layers 206 and sacrificial semiconductor layers 208. Inner dielectric spacers 210 are positioned between the channel semiconductor layers 206, separating sacrificial semiconductor 208 from the lower/upper S/D regions 212 and 216.

Lower source/drain structures 212 and upper source drain structures 216 are epitaxially grown from sidewalls of the channel semiconductor layers 206, separated by source/drain isolation dielectric structures 214. The lower source/drain structures 212 and the upper source/drain structures 216 may have respective dopants that determine a polarity of a transistor device, with the lower source/drain structures 212 and the upper source/drain structures 216 having opposite polarities. Dummy gate spacers 218 and dummy gates 220 are formed over respective device regions. An interlayer dielectric 222 fills the gaps between the gates 220.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The stack of semiconductor layers may be formed by sequential epitaxial growth processes from the top surface of the device regions of the semiconductor substrate. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The channel layers 206 may thus be formed from silicon, and the sacrificial layers 208 may be formed from silicon germanium, for example with a germanium concentration of about 35%. The silicon germanium may be selectively etched, with an etch that preferentially removes silicon germanium at a greater rate than silicon, based on the concentration of germanium. As used herein, the term "selective" in reference to a material removal process denotes that the rate of material removal for a first material is greater than the rate of removal for at least another material of the structure to which the material removal process is being applied.

The isolation layers 204, including a bottom dielectric isolation layer and upper/lower device dielectric isolation layers, may be formed by replacing layers of the stacks of semiconductor layers. For example, the stacks of semiconductor layers may be formed with a second sacrificial semiconductor layer that may be selectively etched, such as silicon germanium with a germanium concentration that is higher than the germanium concentration of the sacrificial layers 208. The second sacrificial semiconductor layers may be etched away, leaving gaps in the semiconductor stacks, which may then be filled with a dielectric material (e.g., silicon nitride) using a conformal deposition process.

Inner spacers 210 may be formed by selectively recessing the sacrificial semiconductor layer 208 to form cavities, followed by filling the cavities with a conformal dielectric deposition and isotropic dielectric etching back process, such that the dielectric is removed everywhere except the region pinch-offed in the cavities.

The dummy gate spacers 218 may be formed from, e.g., silicon nitride, SiBCN, SiOCN, SiOC, etc., and the dummy gates 220 may be formed from, e.g., polycrystalline silicon. A thin layer of silicon dioxide may be deposited prior to polysilicon deposition for dummy gate. The interlayer dielectric 222 may be formed from, e.g., silicon dioxide.

Figure 3:
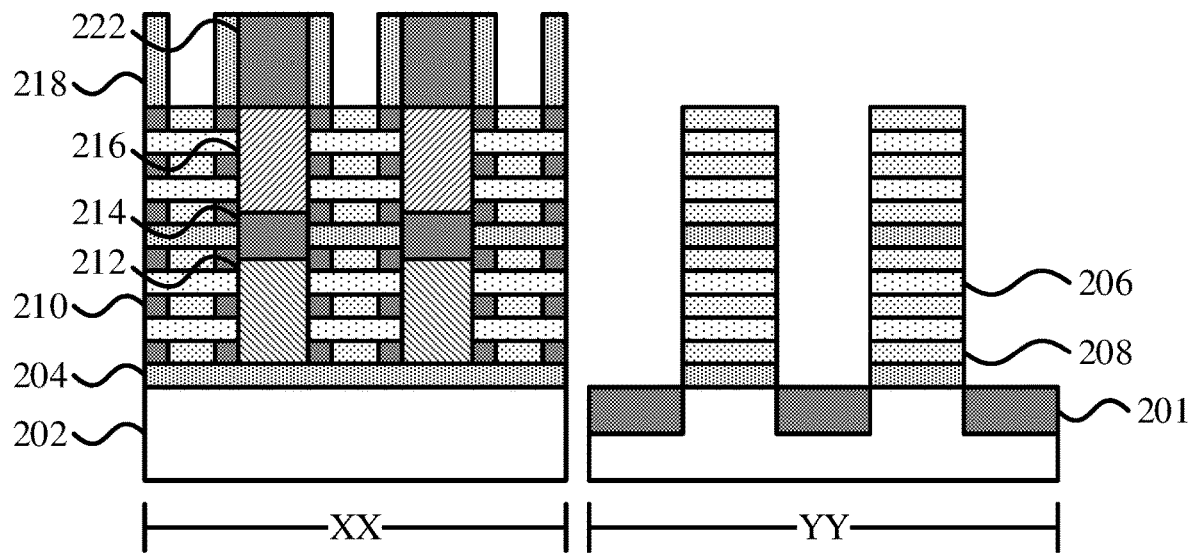
FIG. 3 is a set of cross-sectional views of a step in the formation of stacked CFET devices, where the dummy gates are etched away to expose the stacks of nanosheets, in accordance with an embodiment of the present invention.

Referring now to FIG. 3, a set of cross-sectional views of a step in the fabrication of stacked CFET devices is shown. The dummy gates 220 are selectively etched away, exposing sidewalls of the stacks of semiconductor layers in the YY plane. As shown in the XX plane, these layers are still supported on their sides by the lower source/drain structures 212 and upper source/drain structures 216.

Figure 4:
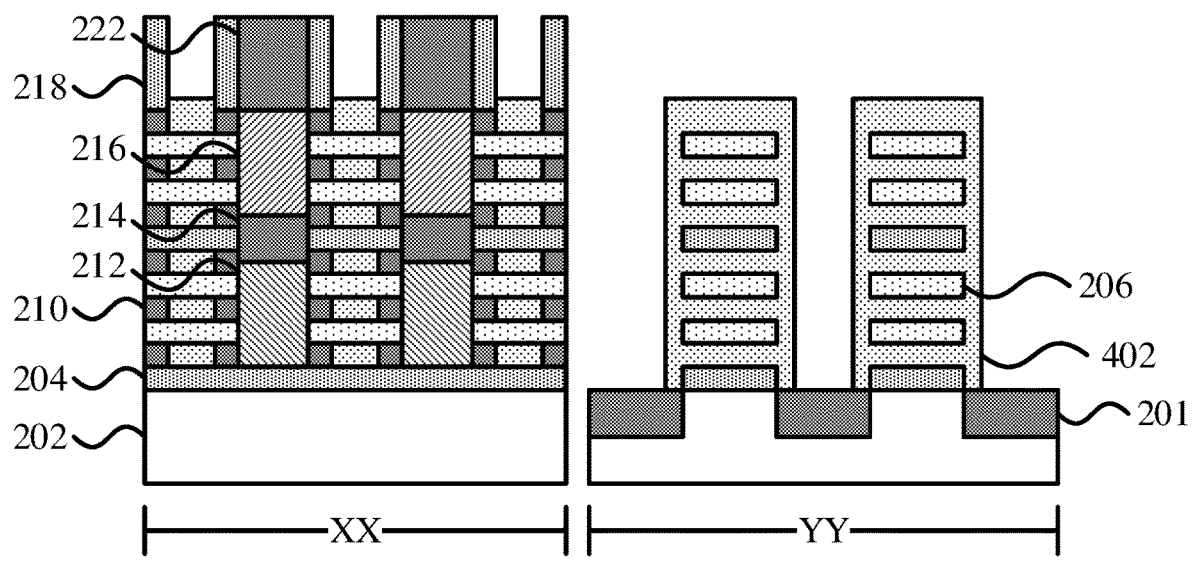
FIG. 4 is a set of cross-sectional views of a step in the formation of stacked CFET devices, where sacrificial material is epitaxially grown on the stacks of nanosheets, in accordance with an embodiment of the present invention, in accordance with an embodiment of the present invention.

Referring now to FIG. 4, a set of cross-sectional views of a step in the fabrication of stacked CFET devices is shown. Additional sacrificial semiconductor material is grown from the stack of semiconductor layers, which merges the sacrificial layers 208 into a sacrificial structure 402 that surrounds the channel semiconductor layers 206.

Figure 5:
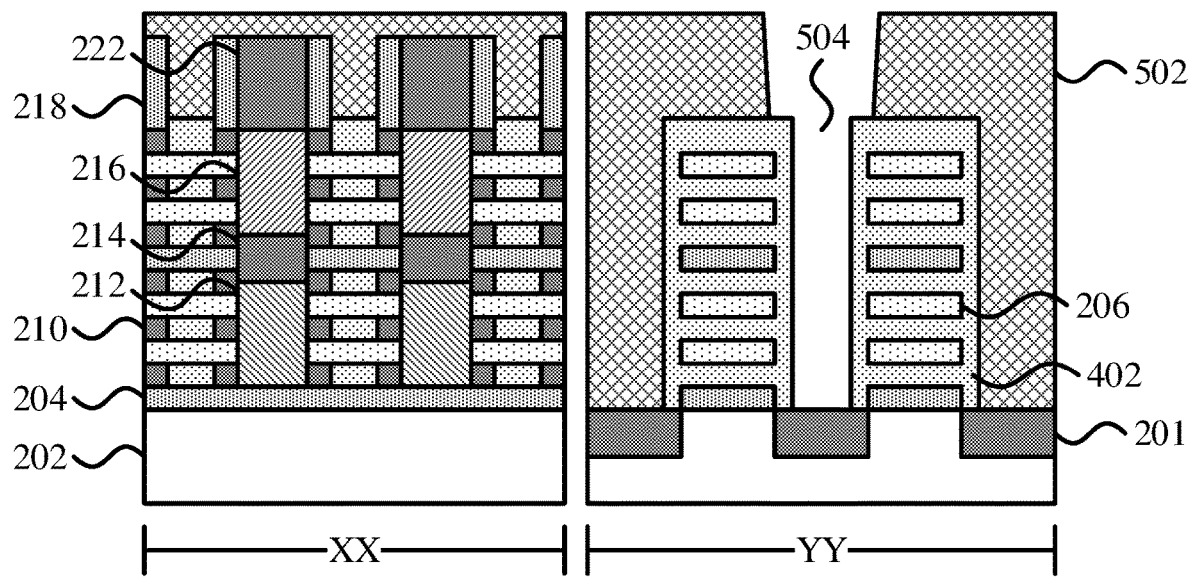
FIG. 5 is a set of cross-sectional views of a step in the formation of stacked CFET devices, where a lower gate cut mask is formed that leaves exposed a region between the stacks of nanosheets, in accordance with an embodiment of the present invention.

Referring now to FIG. 5, a set of cross-sectional views of a step in the fabrication of stacked CFET devices is shown. A soft mask layer (such as organic planarizing layer (OPL)) 502 is deposited over the sacrificial structure 402, and is then patterned and etched to form gate cut trench 504 using a selective etch, such as a reactive ion etch (RIE) which only etches soft mask layer 502, but not surrounding materials, such as sacrificial structure 402. The gate cut trench 504 exposes a region between the stacks of semiconductor layers.

The patterning may be performed using any appropriate process, such as photolithography, where a mask is formed using a photoresist that is cured upon exposure to an appropriate wavelength of light. The pattern of the mask is then etched down into the underlying layer. RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 6:
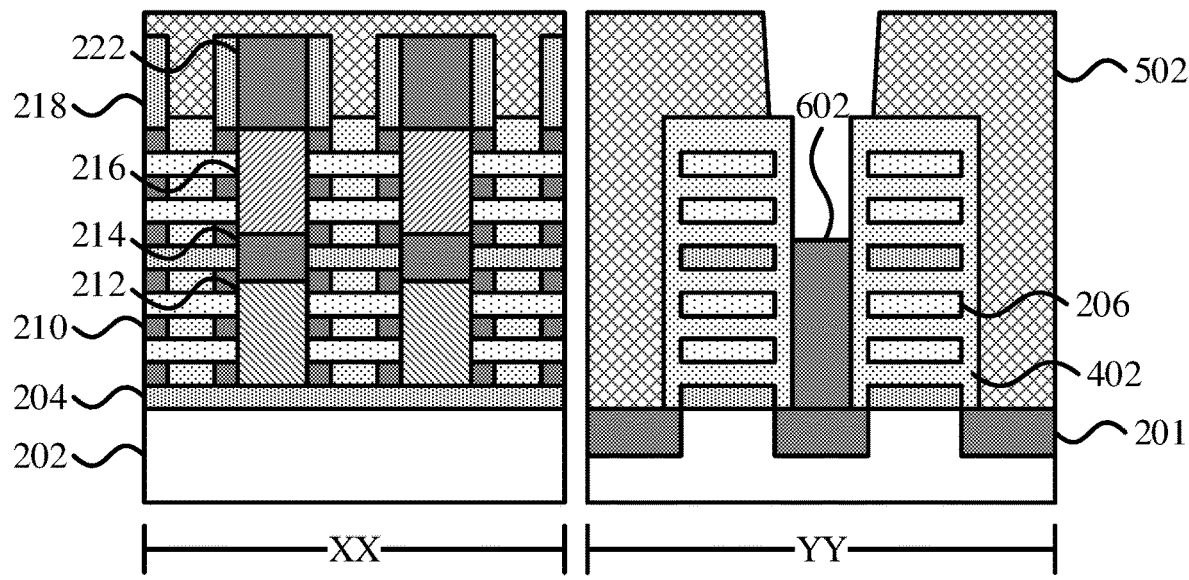
FIG. 6 is a set of cross-sectional views of a step in the formation of stacked CFET devices, where a lower gate cut structure is formed in the region between the stacks of nanosheets, in accordance with an embodiment of the present invention.

Referring now to FIG. 6, a set of cross-sectional views of a step in the fabrication of stacked CFET devices is shown. A lower gate cut isolation dielectric structure 602 is formed between the stacks of semiconductor layers. For example, silicon dioxide or silicon nitride may be deposited using any appropriate deposition process, such as a low temperature chemical vapor deposition (CVD). The height of the lower gate cut isolation dielectric structure 602 may be recessed back to be between the upper semiconductor layers and the lower semiconductor layers, for example close to a height of the upper/lower device dielectric isolation layers 204.

Figure 7:
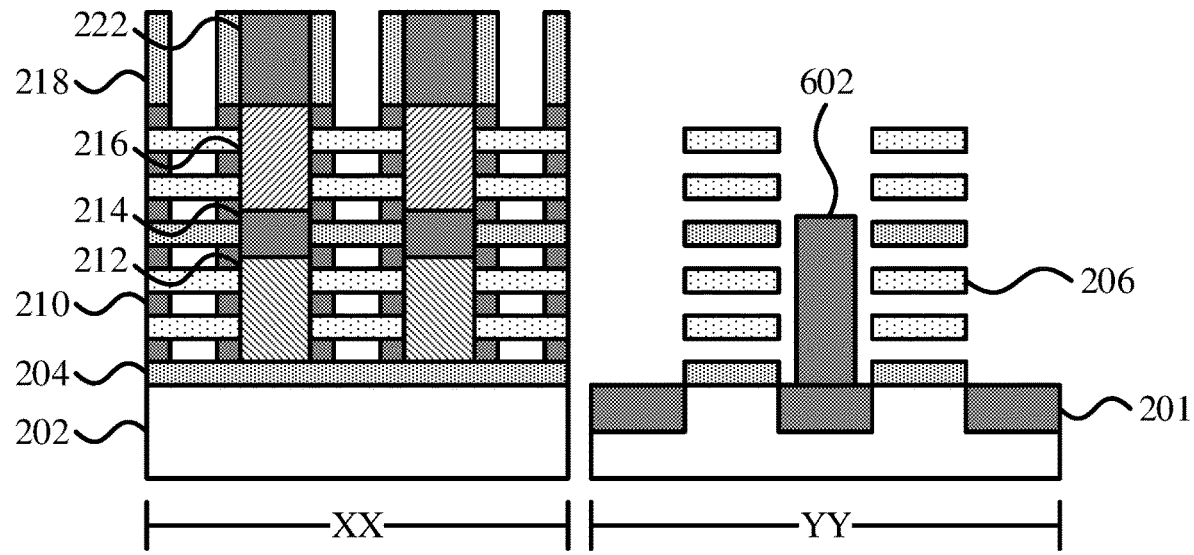
FIG. 7 is a set of cross-sectional views of a step in the formation of stacked CFET devices, where the lower gate cut mask and the sacrificial material is etched away from the stacks of nanosheets, in accordance with an embodiment of the present invention.

Referring now to FIG. 7, a set of cross-sectional views of a step in the fabrication of stacked CFET devices is shown. The organic planarizing layer 502 is removed, for example by an ashing process. The sacrificial structures 402 are selectively etched using an isotropic etch, such as a wet or dry chemical etch. This exposes the channel semiconductor layers 206.

Figure 8:
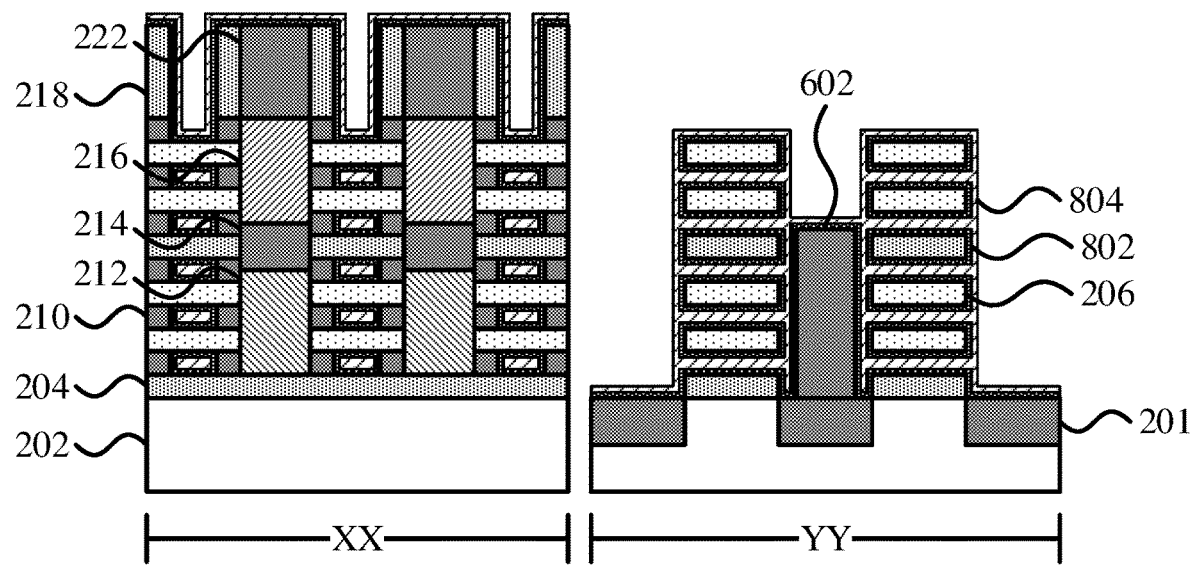
FIG. 8 is a set of cross-sectional views of a step in the formation of stacked CFET devices, where a gate dielectric layer and a first work function metal are deposited, in accordance with an embodiment of the present invention.

Referring now to FIG. 8, a set of cross-sectional views of a step in the fabrication of stacked CFET devices is shown. A gate stack is deposited around the channel semiconductor layers 206. The gate stack may include a gate dielectric layer 802 and a first work function metal 804, each of which may be deposited using successive conformal deposition processes.

The gate dielectric layer 802 may be formed from any appropriate dielectric material, such as a high-k dielectric material. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The first work function metal 804 may be an n-type work function metal or a p-type work function metal. As used herein, a "p-type work function metal" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

Figure 9:
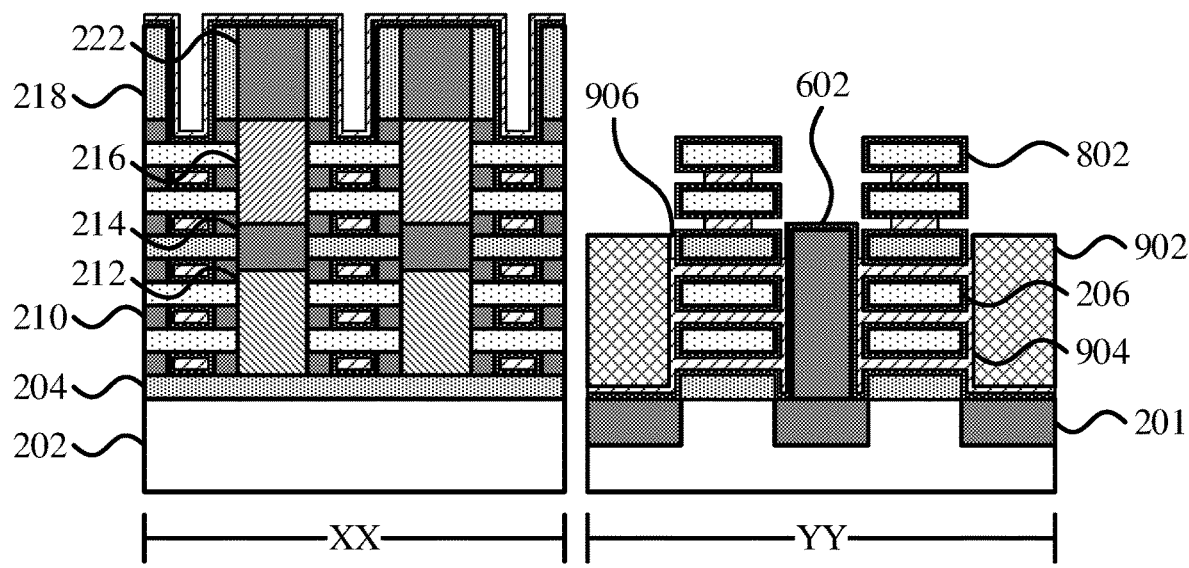
FIG. 9 is a set of cross-sectional views of a step in the formation of stacked CFET devices, where the first work function metal is etched back, in accordance with an embodiment of the present invention.

Referring now to FIG. 9, a set of cross-sectional views of a step in the fabrication of stacked CFET devices is shown. An organic planarizing layer 902 is deposited using any appropriate deposition process and then is recessed back to a height below the top semiconductor layers, for example at a height of the upper/lower device dielectric isolation layers 204. Exposed portions of the first work function metal 802 are etched back, leaving lower work function metal layer 904, which is protected from the etch by the organic planarizing layer 902. Portions of the first work function metal 804 may also remain between the upper channel semiconductor layers 206. The etch creates divots 906 between the organic planarizing layer 902 and the upper/lower device dielectric isolation layers 204.

Figure 10:
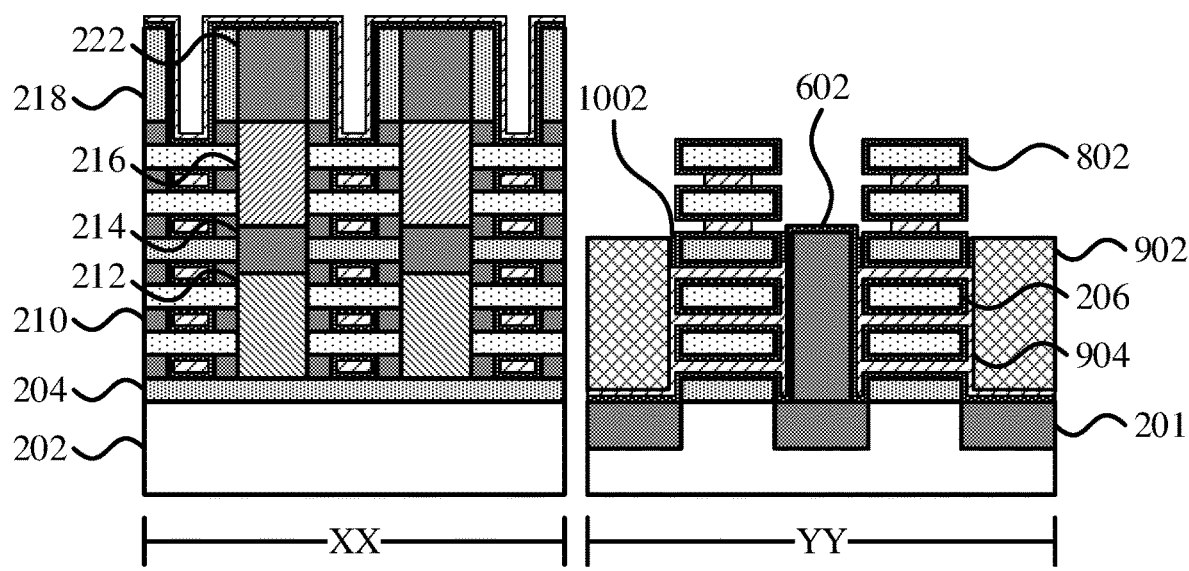
FIG. 10 is a set of cross-sectional views of a step in the formation of stacked CFET devices, where dielectric plugs are formed, in accordance with an embodiment of the present invention.

Referring now to FIG. 10, a set of cross-sectional views of a step in the fabrication of stacked CFET devices is shown. The divots 902 are filled with a dielectric fill 1002, for example using silicon dioxide or silicon nitride, deposited by a conformal deposition process, such as ALD, followed by an isotropic etch back process. The upper/lower device dielectric isolation layers 204, the gate dielectric 802, and the dielectric fill 1002 form a cap over the lower channel semiconductor layers 206 and the lower work function metal layer 904.

Figure 11:
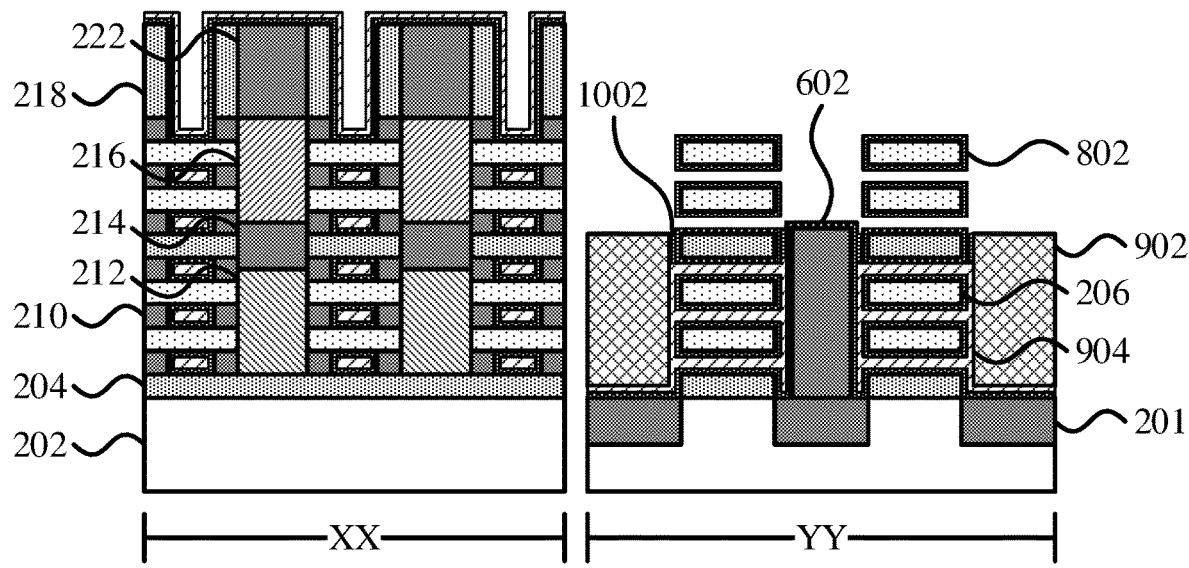
FIG. 11 is a set of cross-sectional views of a step in the formation of stacked CFET devices, where remnants of the first work function metal are etched away from between the upper channel nanosheets, in accordance with an embodiment of the present invention.

Referring now to FIG. 11, a set of cross-sectional views of a step in the fabrication of stacked CFET devices is shown. An extended etch is used to completely remove the remnants of the first work function metal 802 from between the upper channel semiconductor layers 206.

Figure 12:
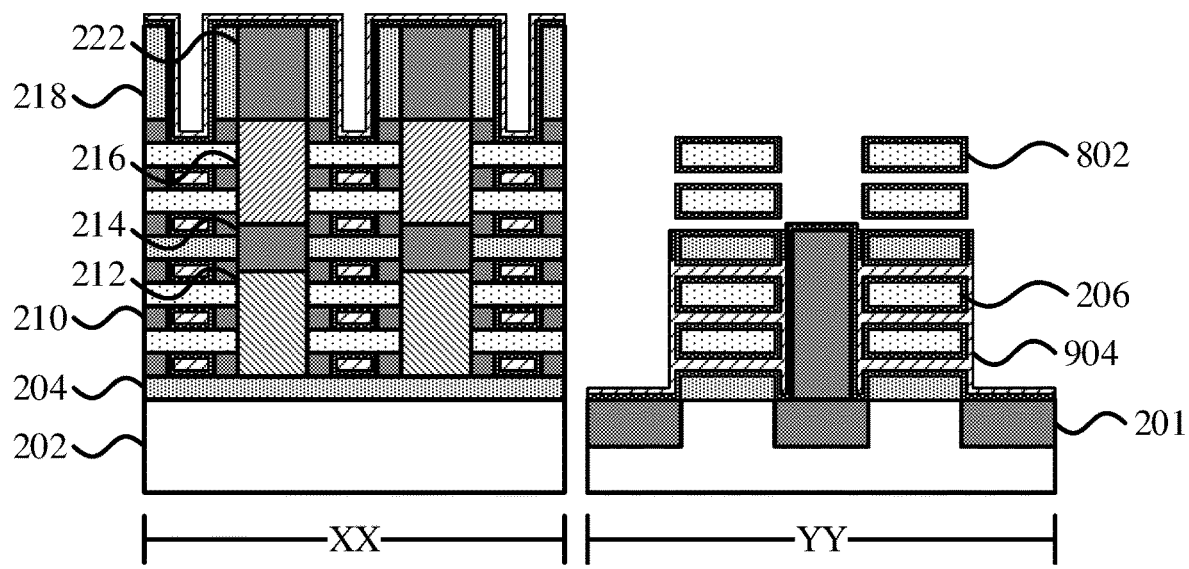
FIG. 12 is a set of cross-sectional views of a step in the formation of stacked CFET devices, where sacrificial masks are etched away, in accordance with an embodiment of the present invention.

Referring now to FIG. 12, a set of cross-sectional views of a step in the fabrication of stacked CFET devices is shown. The organic planarizing layer 902 may be removed, for example using an ashing process, which exposes the lower work function metal layer 904.

Figure 13:
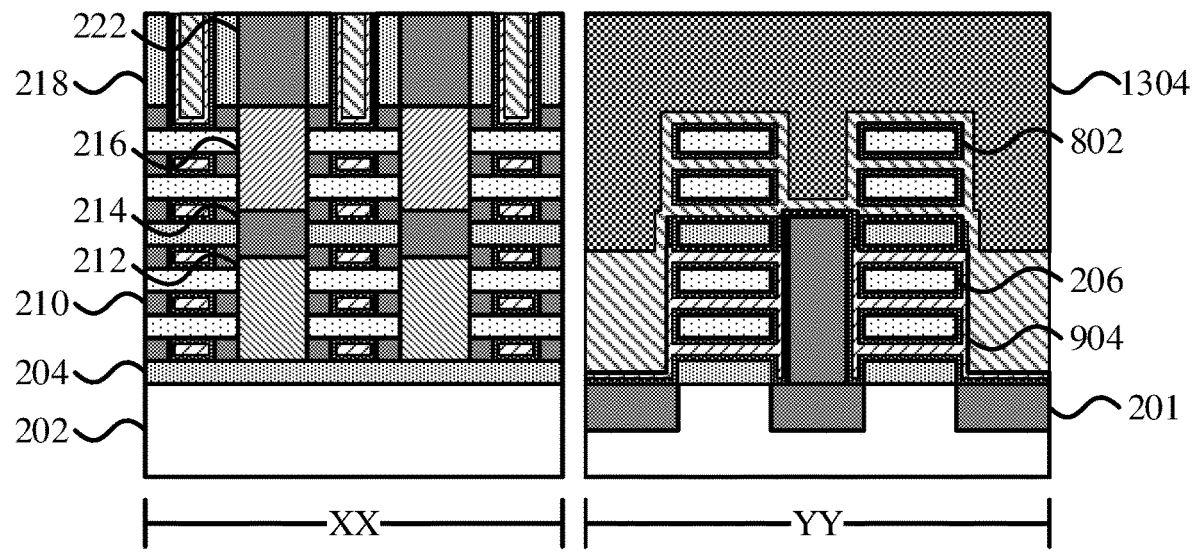
FIG. 13 is a set of cross-sectional views of a step in the formation of stacked CFET devices, where a second work function metal and a gate conductor are deposited, in accordance with an embodiment of the present invention.

Referring now to FIG. 13, a set of cross-sectional views of a step in the fabrication of stacked CFET devices is shown. An upper work function metal layer 1302 is conformally deposited over the upper channel semiconductor layers 206 and on sidewalls of the lower work function metal layer 904. The upper work function metal layer 1302 may include a second work function metal, which may have a polarity that is opposite to the polarity of the material of the lower work function metal layer 904.

A gate conductor 1304 may then be deposited over the upper work function metal layer 1302 using any appropriate deposition process, such as CVD, physical vapor deposition (PVD), or atomic layer deposition (ALD). The gate conductor 1304 may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. The gate conductor 1304 may alternatively be formed from a doped semiconductor material such as, e.g., doped polysilicon.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 14:
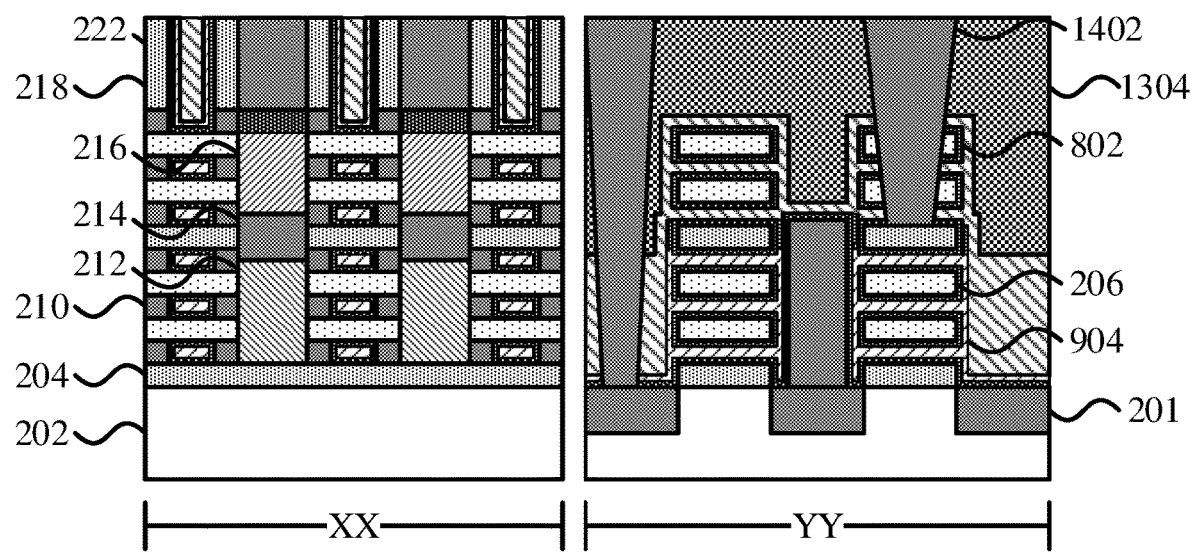
FIG. 14 is a set of cross-sectional views of a step in the formation of stacked CFET devices, where upper gate cuts are formed, in accordance with an embodiment of the present invention.

Referring now to FIG. 14, a set of cross-sectional views of a step in the fabrication of stacked CFET devices is shown. Gate cuts 1402 are formed. The gate cuts 1402 may be formed with one or more anisotropic etches to penetrate through the gate conductor 1304, the upper work function metal layer 1302, the lower work function metal layer 904, the gate dielectric layer 802, and the channel semiconductor layers 206 as appropriate for the location. The etched area may then be filled with any appropriate dielectric material, such as silicon dioxide.

In some cases, a gate cut 1402 cut all the way down to the level of the STI regions 201, which entirely separates the CFET device from neighboring devices. In other cases, a gate cut 1402 may penetrate through the upper semiconductor channel layers 206. In such a case, the upper device may be deactivated, leaving the lower device intact. This may be useful in, e.g., SRAM devices, where nFET, pFET, and cFET devices may be connected to one another in particular arrangements.

Figure 15:
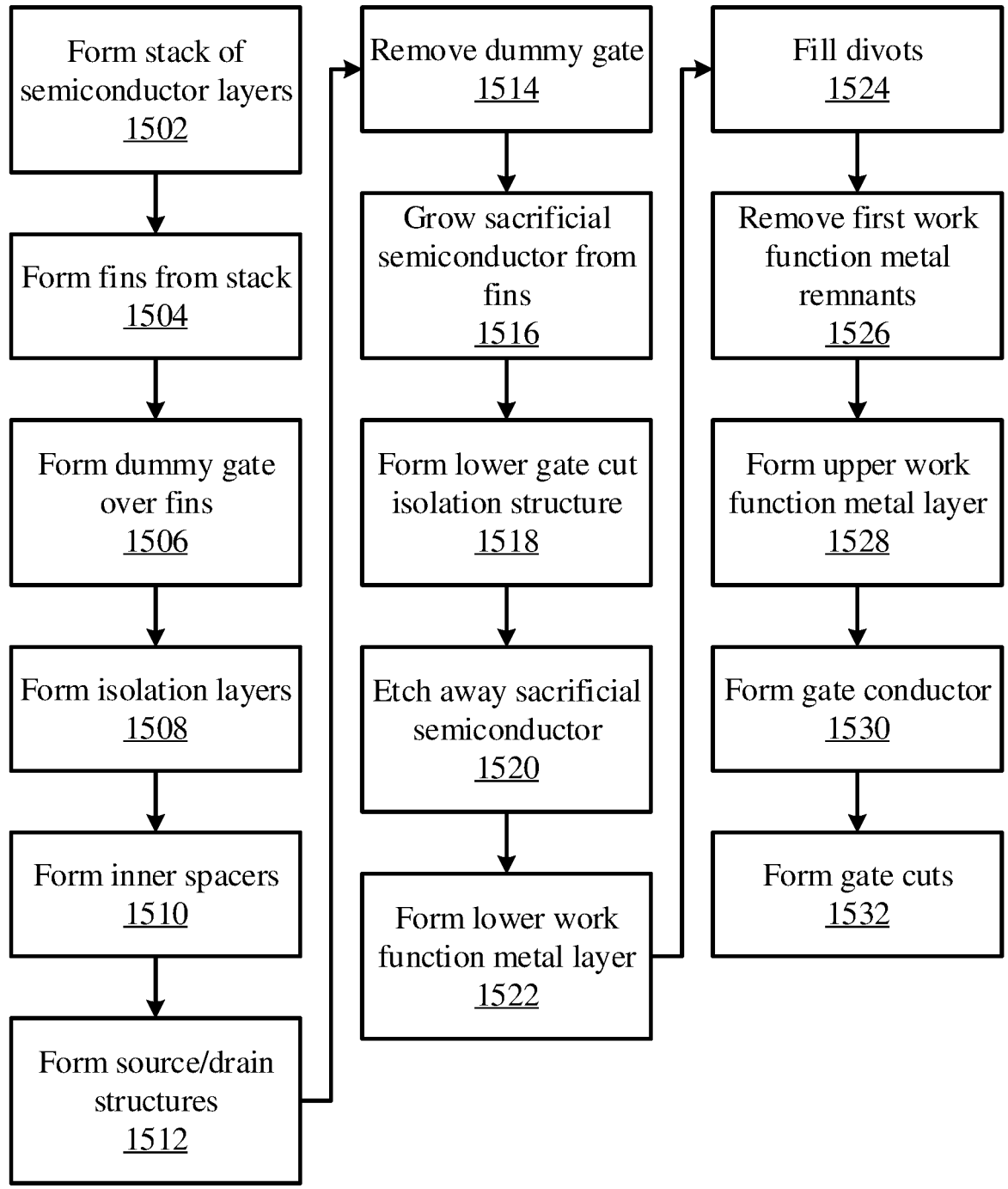
FIG. 15 is a block/flow diagram of a metho of forming stacked CFET devices, in accordance with an embodiment of the present invention.

Referring now to FIG. 15, a method of forming stacked CFETs is shown. Block 1502 forms a stack of semiconductor layers on a substrate, which may include forming a stack of channel semiconductor layers, first sacrificial layers, and second sacrificial layers. The layers may be epitaxially grown from one another, with exemplary channel semiconductor layers being formed from silicon, exemplary first sacrificial semiconductor layers being formed from silicon germanium with a first germanium concentration, and exemplary second sacrificial semiconductor layers being formed from silicon germanium with a second, higher germanium concentration.

Block 1504 forms fins from the stack, for example by patterning the stack using a photolithographic process and anisotropically etching the layers. STI regions 201 may be formed at this stage, by etching down into the substrate 202 and filling the resulting trenches with dielectric material.

Block 1506 forms a dummy gate 220 over the fins, for example including dummy gate spacers 218. The dummy gate 220 may be formed by depositing an appropriate dummy gate material, such as polysilicon, and then patterning the dummy gate. Dummy gate spacers 218 may be formed by conformally depositing a dielectric material and then anisotropically etching the dielectric material from horizontal surfaces.

Block 1508 forms the isolation layers 204. This may be performed by etching away the second sacrificial semiconductor layers using a selective isotropic etch, removing the second sacrificial semiconductor material from underneath the other semiconductor layers. A dielectric material may then be conformally deposited, filling the space left by the removal of the second sacrificial semiconductor layers.

Block 1510 forms inner spacers 210. For example, the first sacrificial semiconductor layers may be recessed relative to the channel semiconductor layers 206, with the resulting spaces being filled by a conformal deposition of dielectric material. In another example, a condensation/oxidation process may be used to form the inner spacers 210 by preferentially forming silicon dioxide at the surface of silicon germanium first sacrificial semiconductor layers, followed by an etch to remove extraneous silicon dioxide from sides of the fins.

Block 1512 epitaxially grows source/drain structures from exposed side surfaces of the channel semiconductor layers 206. This process may include alternately masking an upper region and a lower region, while respective n-type or p-type dopants are used to create source/drain structures for a respective device type.

Block 1514 selectively etches away the dummy gate 220 using any appropriate etching process. Additional first sacrificial semiconductor material is epitaxially grown from surfaces of the channel semiconductor layers 206 and the sacrificial semiconductor layers 208 in block 1516, forming a sacrificial structure 402 that extends laterally beyond the boundaries of the stack.

Block 1518 forms lower gate cut isolation structure 602, which separates the lower devices of neighboring CFET devices from one another. An organic planarizing layer 502 may be formed with a gate cut trench in the region between the stacks, and dielectric material may be formed in the trench. The organic planarizing layer 502 may then be removed.

Block 1520 then etches away the sacrificial semiconductor structure 402 using a selective isotropic etch that removes the sacrificial semiconductor material from between the channel semiconductor layers 206.

Block 1522 forms a lower work function metal layer 904 on a set of lower channel semiconductor layers 206 (e.g., those below the isolation layer 204). This may be accomplished by conformally depositing a first work function metal, which is then etched back using organic planarizing layers 902 to set a height of the lower work function metal layer 904. Block 1524 fills divots that may be left over the lower work function metal layer 904 with a dielectric material 1002.

Block 1526 removes remnants of the first work function metal from between the upper channel semiconductor layers 206. The organic planarizing layers 902 may then be removed. Block 1528 forms the upper work function metal layer 1302 by conformally depositing a second work function metal having an appropriate polarity for the upper device. Block 1530 forms a gate conductor 1304 over the upper work function metal layer 1302 by any appropriate deposition process.

Gate cuts 1402 may then be formed, for example by patterning the gate cut regions using photolithography, followed by one or more anisotropic etches to form gate cut regions. The gate cut regions are then filled with a dielectric material using any appropriate deposition process. The gate cuts 1402 may separate CFET devices from one another, and may further deactivate upper devices in a stacked CFET device. Appropriate contacts may be formed to contact the gate conductor 1304, the upper source/drain structures 216, and the lower source/drain structures 212.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of hybrid gate cuts for stacked transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device, comprising:
   forming a first stack of nanosheets in a first region, the first stack of nanosheets including upper first nanosheets and lower first nanosheets;
   forming a second stack of nanosheets in a second region, the second stack of nanosheets including upper second nanosheets and lower second nanosheets;
   forming a lower gate cut structure between the lower first nanosheets and the lower second nanosheets;
   forming a gate stack on the first and second stack of nanosheets and over the lower gate cut structure after forming the lower gate cut structure; and
   forming an upper gate cut structure after forming the gate stack.

2. The method of claim 1, wherein forming the upper gate structure includes etching through the upper second nanosheets.

3. The method of claim 1, wherein the first stack of nanosheets includes first sacrificial layers and first channel layers and the second stack of nanosheets includes second sacrificial layers and second channel layers.

4. The method of claim 3, further comprising growing additional sacrificial material from the first stack of nanosheets and the second stack of nanosheets.

5. The method of claim 4, wherein forming the lower gate structure includes depositing dielectric material in a space between the first stack of nanosheets and the second stack of nanosheets, after growing the additional sacrificial material.

6. The method of claim 5, further comprising etching away the additional sacrificial material and the sacrificial layers of the first stack of nanosheets and the second stack of nanosheets before forming the gate stack.

7. The method of claim 1, wherein forming the gate stack includes:
   depositing a first work function metal layer on the upper first nanosheet and the upper second nanosheet; and
   etching the first work function metal layer back to expose the upper first nanosheets and the upper second nanosheets to form a lower work function metal layer.

8. The method of claim 7, wherein forming the gate stack includes forming dielectric plugs between the lower work function metal layer and the lower gate cut structure.

9. The method of claim 8, further comprising etching away first work function metal layer remnants from between the upper first nanosheet stacks and from between the upper second nanosheet stacks after forming the dielectric plugs.

10. A method of forming a semiconductor device, comprising:
    forming a first stack of nanosheets in a first region, the first stack of nanosheets including upper first nanosheets and lower first nanosheets;
    forming a second stack of nanosheets in a second region, the second stack of nanosheets including upper second nanosheets and lower second nanosheets;
    forming a lower gate cut structure between the lower first nanosheets and the lower second nanosheets;
    forming a gate stack on the first and second stack of nanosheets and on the lower gate cut structure after forming the lower gate cut structure, including:
       depositing a first work function metal layer on the upper first nanosheets and the upper second nanosheets;
       etching the first work function metal layer back to expose the upper first nanosheets and the upper second nanosheets to form a lower work function metal layer;
       forming dielectric plugs between the lower work function metal layer and the lower gate cut structure; and
       depositing a second work function metal layer on the upper first nanosheets and the upper second nanosheets; and
    forming an upper gate cut structure after forming the gate stack.

11. A semiconductor device, comprising:
    a first stack of channel layers in a first region, the first stack of channels including upper first channels and lower first channels;
    a second stack of channel layers in a second region, the second stack of channels including upper second channels and lower second channels;
    a lower gate cut structure between the lower first channels and the lower second channels and not between the upper first channels and upper second channels; and
    a shared gate that makes electrical contact with the upper and lower first nanosheets and the upper second nanosheets.

12. The semiconductor device of claim 11, further comprising an upper gate cut structure that penetrates the upper second channels.

13. The semiconductor device of claim 11, wherein the first stack of channel layers includes a first isolation dielectric layer between the upper first channels and the lower first channels.

14. The semiconductor device of claim 13, wherein the first isolation dielectric layer includes a central dielectric material, a gate dielectric material surrounding the central dielectric material, and dielectric plugs on sidewalls of the gate dielectric material.

15. The semiconductor device of claim 13, wherein a top surface of the lower gate cut structure has a height that reaches at least a height of a bottom surface of the first isolation dielectric layer.

16. The semiconductor device of claim 11, wherein the first stack includes a first work function metal around the first lower channel layers and a second work function metal around the first upper channel layers.

17. The semiconductor device of claim 16, wherein a portion of the first work function metal is between the first lower channel layers and the lower gate cut structure.

18. The semiconductor device of claim 16, wherein the first work function metal has a first polarity and the second work function metal has a second polarity, opposite to the first polarity.

19. The semiconductor device of claim 11, wherein the first isolation dielectric layer has a height that does not reach a height of the first upper channel layers.

20. The semiconductor device of claim 11, further comprising a gate cut structure that penetrates from a top surface of the shared gate to an underlying substrate.

* * * * *